(12) United States Patent
Khalid

(10) Patent No.: US 9,953,202 B2
(45) Date of Patent: Apr. 24, 2018

(54) NANOSTRUCTURE BASED SUPER-CAPACITOR FOR PRESSURE AND FINGERPRINT SENSOR

(71) Applicant: Waqas Khalid, Berkeley, CA (US)

(72) Inventor: Waqas Khalid, Berkeley, CA (US)

( * ) Notice: Subject to any disclaimer, the term of this patent is extended or adjusted under 35 U.S.C. 154(b) by 145 days.

(21) Appl. No.: 15/152,504

(22) Filed: May 11, 2016

(65) Prior Publication Data
US 2017/0330010 A1 Nov. 16, 2017

(51) Int. Cl.
*G06K 9/00* (2006.01)
*H05K 1/18* (2006.01)
*G01R 27/26* (2006.01)

(52) U.S. Cl.
CPC ....... *G06K 9/0002* (2013.01); *G01R 27/2605* (2013.01); *G06K 9/0008* (2013.01);
(Continued)

(58) Field of Classification Search
None
See application file for complete search history.

(56) References Cited

U.S. PATENT DOCUMENTS

| 2006/0138394 | A1* | 6/2006 | Den | B81B 1/002 257/3 |
| 2008/0111164 | A1* | 5/2008 | Awano | B82Y 10/00 257/284 |

(Continued)

*Primary Examiner* — Delomia L Gilliard
(74) *Attorney, Agent, or Firm* — McCarter & English, LLP; Jonathan M. Sparks

(57) ABSTRACT

An arrangement of individually addressable nanostructures (200) in an array format on a substrate (100) (non-conducting, flexible or rigid) with electrical portions (conducing) in the substrate where the electrical portions form electrical contacts with the nanostructures is utilized to form individually addressable nanostructures. The said nanostructures can be 1-1,000,000 nm in base size and range from 1-1,000,000 nm in height. The distance between the said nanostructures in the array can also range from 10-1,000,000 nm. The said nanostructures are covered in a dielectric material (300) (air, polymer, ceramic) that is at least 5-500,000 nm thicker than the height of the said nanostructures. The dielectric properties of the dielectric material are an important component in determining the capacitance/supercapacitance properties of the fingerprint device. A top electrode (400) is placed on the face of dielectric film opposite to the face in contact with the substrate where nanostructures are arranged. A top layer (500) (glass or Other robust material) is placed on top of the top metal electrode. A voltage V (900) is applied between the nanostructures (200) and the top electrodes (400), an intense electric field (600) is generated between the nanostructures (200) and the top electrode (400). The direction of the said electrical field is dependent on the polarity of the voltage applied. The electric capacitance (700) between the nanostructures and the top electrode as formed. When a finger (1000) is placed on the device, the ridges (1001) of the fingerprints make contact with the top layer (500) of the device causing a signal, (a change in the capacitance of the device) that can be detected using external circuits. The valleys (1002) of the finger do not make contact with the top layer (500) device and hence do not produce a signal. If a pressure is applied on the top layer (500), the distance between the top electrode (400) and the nanostructures (200) is reduced, causing a change in the capacitance, allowing measurement of pressure. Since the nanostructures (200) are distributed on a surface (2000) in sections (2010) we can obtain special resolution of pressure on a surface or gather fingerprints using a cost effective, low power, robust and stand-alone portable, miniature system.

20 Claims, 7 Drawing Sheets

(52) U.S. Cl.
CPC ......... *H05K 1/185* (2013.01); *H05K 2201/09* (2013.01); *H05K 2201/10015* (2013.01); *H05K 2201/10151* (2013.01)

(56) References Cited

U.S. PATENT DOCUMENTS

| | | | |
|---|---|---|---|
| 2009/0173931 A1* | 7/2009 | Stumbo | B81C 99/008 257/14 |
| 2009/0179523 A1* | 7/2009 | Wang | B82Y 10/00 310/338 |
| 2009/0242405 A1* | 10/2009 | Mayer | B81C 1/00214 204/435 |
| 2016/0335469 A1* | 11/2016 | Chiang | G06F 3/0488 |
| 2017/0200038 A1* | 7/2017 | Chiang | G06K 9/0002 |

* cited by examiner

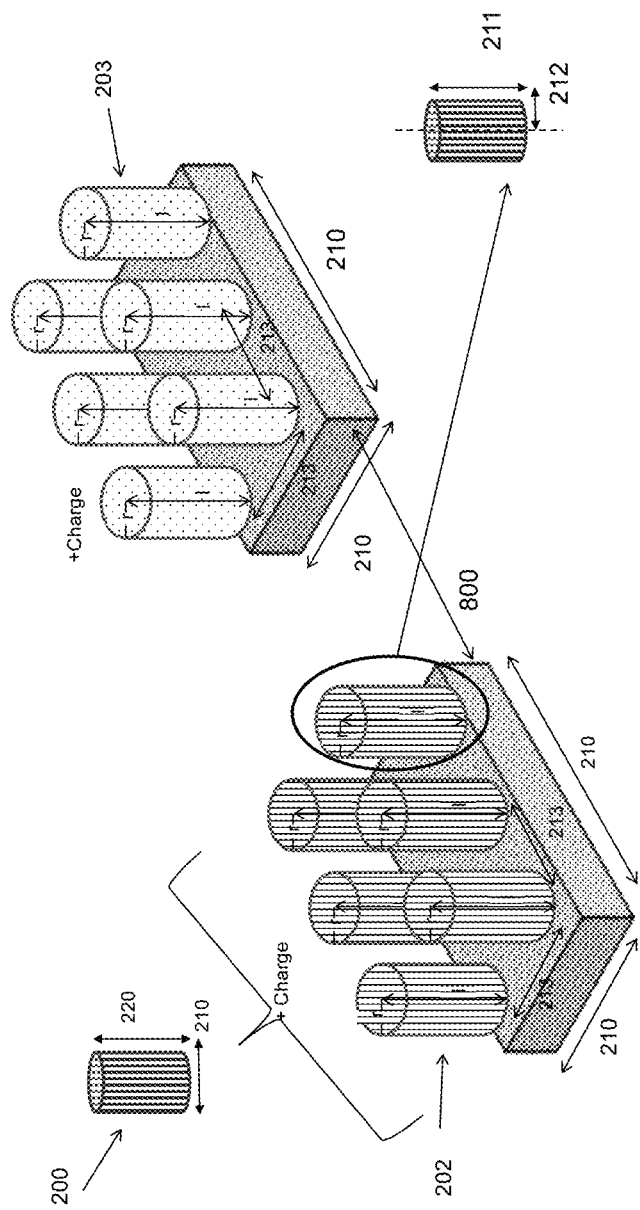

NANOSTRUCTURE BASED SUPER-CAPACITOR FOR PRESSURE AND FINGERPRINT SENSOR

CROSS REFERENCE TO RELATED APPLICATION & PRIORITY CLAIM

This application claims priority to and the benefit of U.S. Provisional Application No. 62/159,957 filed on May 11, 2015, which is incorporated herein by reference in its entirety as if fully set forth below.

FIELD OF INVENTION

The present invention relates to an electrical device comprising of individually addressable nanostructures in an array format and methods of utilizing the device as pressure and fingerprint sensor based on super capacitor properties of the system.

BACKGROUND OF INVENTION

Biometric methods to enhancing security for personal belongings and information is a booming field in the modern world. Fingerprints are one of the leading biometric features that are used for identity verification. Various fingerprint sensors are available in today's world that rely on different methods to scan fingerprints including optical, thermal and pressure sensors. Capacitive sending is also employed to capture fingerprints [1]. Generally capacitive finger print sensors comprise of sensing and driving electrodes in array format [1]. Since the advancement of nanotechnology scientists have developed individually addressable nanostructures [2]. Such nanostructures can be packed in a minute space and hence provide higher resolution for various sensing applications including fingerprint sensing, pressure sensing and tactile sensing.

[1] Capacitive Touch Sensor for Identifying a Fingerprint; US 20140047706 A 1
[2] Device comprising of nanostructures and method of manufacturing thereof—Waqas Khalid Application no: PCT/EP2012/062744

SUMMARY OF INVENTION

In view of the above mentioned and other prior art, the present invention provides a method of utilizing individually addressable (electrically) nanostructures in an array format to form capacitive sensors for finger print sensors and pressure sensors. An arrangement of individually addressable nanostructures in an array format.

The nanostructures are arranged on a substrate (non-conducting, flexible or rigid) that contains electrical portions (conducing) within the substrate. The electrical portions form electrical contacts with the nanostructures, thus realizing individually electrically addressable nanostructures.

The said nanostructures are 1-1,000,000 nm in base size and range from 1-1,000,000 nm in height. The distance between the said nanostructures in the array is also range from 10-1,000,000 nm.

The said nanostructures are covered in a dielectric material (air, polymer, ceramic) that is at least 1-500,000 nm thicker than the height of the said nanostructures. The dielectric properties of the dielectric material are an important component in determining the capacitance/supercapacitance properties of the fingerprint device.

A top electrode is placed on the face of dielectric film opposite to the face in contact with the substrate where nanostructures are arranged. A top protective layer (glass or Other robust material) is placed on top of the top metal electrode.

A voltage V is applied between the nanostructures and the top electrodes, an intense electric field is generated between the nanostructures and the top electrode. The direction of the said electrical field is dependent on the polarity of the voltage applied. The electric capacitance between the nanostructures and the top electrode as formed.

When a finger is placed on the device, the ridges of the fingerprints make contact with the device causing a signal, (a change in the capacitance of the device) that can be detected using external circuits. The valleys of the fingerprints do not make contact with the device and hence do not produce a signal.

Similarly, the mechanism can be employed to detect pressure changes. When a pressure is applied on the top protective layer, it deforms the top electrode causing a change in the distance between the nanostructures and the top electrode. This results in the capacitance change that can be measured using external circuits attached to the conductive portions in the substrate. The change in the distance can be correlated to the applied pressure based on the properties of the dielectric material (like elasticity) and hence the device can be used to measure pressure.

BRIEF DESCRIPTION OF THE DRAWINGS

FIG. 7 A detailed illustration of two adjacent nanostructures with difference respective charges.

DETAILED DESCRIPTION OF THE PREFERRED EMBODIMENTS

The following are the advantages and some embodiments of the present invention.

Advantages

The following are the advantages of the present invention:
High Electric Field due to Nanostructures (carbon nanotube based) and the top electrode
Low power consumption by the device for operation as it's a passive device
Due to extremely high resolution of nanostructure array already demonstrated, the finger print sensor can be distributed across the home button at various location instead of installing 1 sensor array of a mobile device
This allows flexibility in design
Since the data is collected from higher number of sensors in the same location (other technologies have 1 sensor while we can pack multiple sensor in that same area), the resolution is increased and false signals can be prevented by smart algorithms that can eliminate outlier data-points Ultra-super sensitive capacitance based fingerprint sensor can be realized Spatial resolution of pressure at sub-micron level can be detected and mapped Ultra-sensitive pressure sensor can be realized using this device that is ultra-compact and is a low power consumption device Standalone, miniature, device thickness ranging from 100-1,000 micro meters can utilized Device can be integrated on flexible substrates

DETAILED DESCRIPTION OF THE FIGURES

Figure 1:
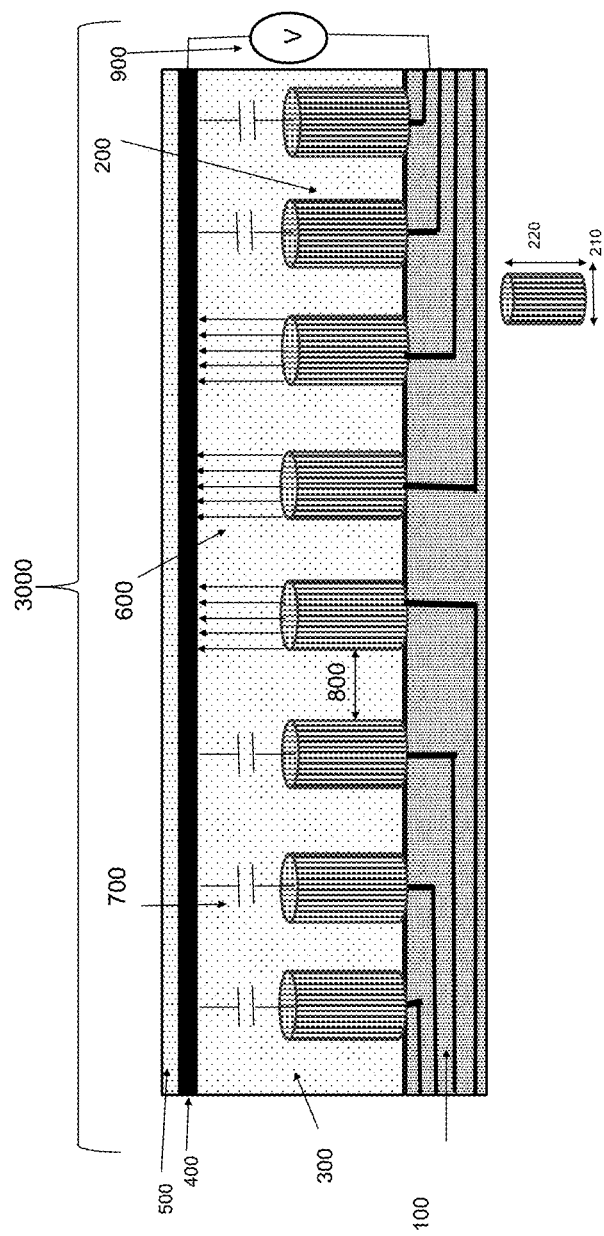
FIG. 1 Illustrates a nanostructure array based device with a continuous top electrode and a top protective layer.

FIG. 1 shows an arrangement of individually addressable nanostructures (200) in an array format. The nanostructures (200) are arranged on a substrate (100) (non-conducting, flexible or rigid) with electrical portions (conducing) in the substrate. The electrical portions form electrical contacts with the nanostructures (200). Thus, individually addressable nanostructures are formed. The nanostructures can be 1-1,000,000 nm in base size (210) and range from 1-1,000,000 nm in height (220). The distance (800) between the nanostructures in the array can also range from 10-1,000,000 nm. The nanostructures are covered in a dielectric material (300) (air, polymer, ceramic) that is at least 5-500,000 nm thicker than the height of the nanostructures. The dielectric properties of the dielectric material is an important component in determining the capacitance/supercapacitance properties of the pressure sensor and the fingerprint device. A top electrode (400) is placed on the face of dielectric film (300) opposite to the face in contact with the substrate (100) where nanostructures (200) are arranged. A top layer (500) (glass or other robust material) is placed on top of the top metal electrode. When a voltage V (900) is applied between the nanostructures and the top electrodes, an intense electric field (600) is generated between the nanostructures (200) and the top electrode (400). The direction of the electrical field is dependent on the polarity of the voltage applied. This results in electric capacitance (700) between the nanostructures (200) and the top electrode (400) as depicted in the FIG. 1. This forms a device (3000).

Figure 2:
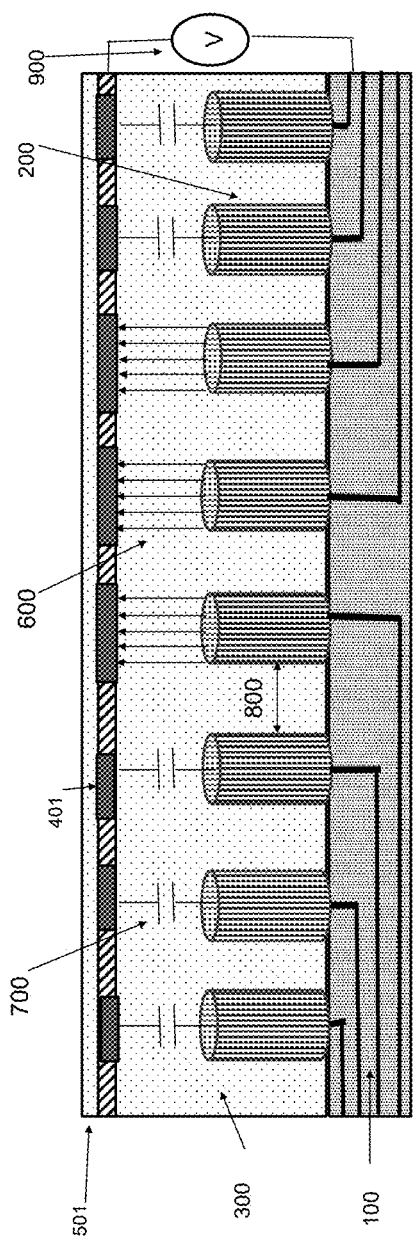
FIG. 2 Illustrates a nanostructure array based device with an addressable array top electrode and a top protective layer.

FIG. 2 shows an arrangement of individually addressable nanostructure (401) based top electrode arrangement on top of the dielectric material (300). The size and shape of the top electrodes (401) can vary similar to the nanostructures (200) in the array format arranged on the substrate (100). The electric field (600) and the capacitance (700) between the top and bottom nanostructures is shown in FIG. 2 as well.

Figure 3:
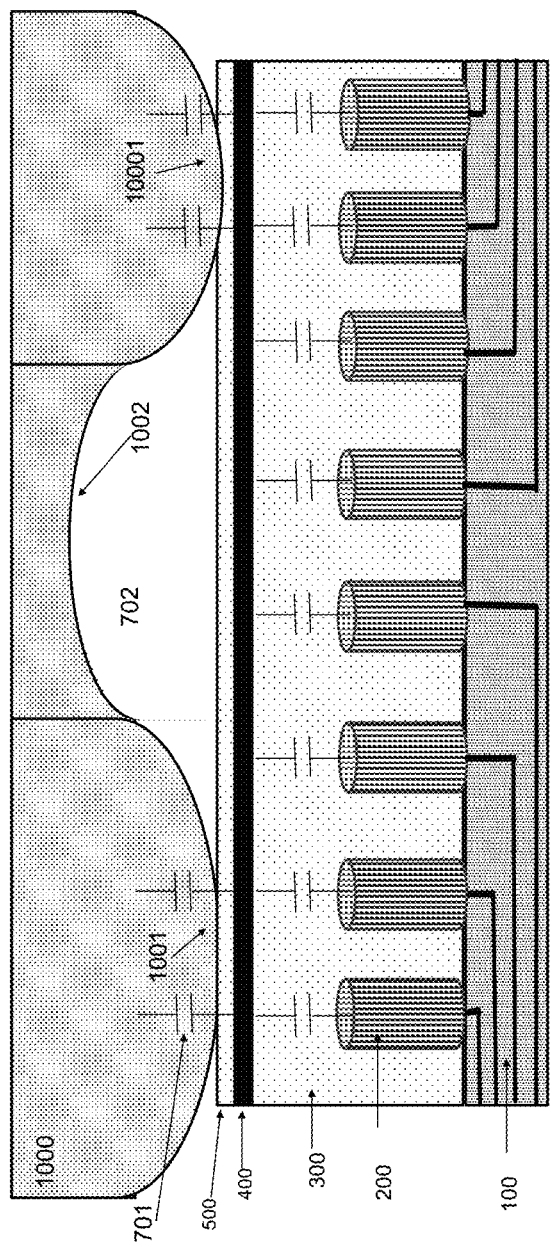
FIG. 3 Illustrates a nanostructure array based device as a fingerprint or pressure sensor.

FIG. 3 shows a finger (1000) placed on the device described in FIG. 1 and FIG. 2. Fingers have ridges (1001) and valleys (1002) that form the Fingerprints. The areas where the ridges (1001) are in contact with the device, a capacitance (701) is developed, resulting in increase in capacitance. This increase in capacitance can be detected as an electrical signal using external circuit attached to the electrical contacts in the substrate. The areas where valleys (1002) are on top of the device, no signal is detected as no increase in the capacitance is created. This mechanism can be employed to perform fingerprint sensing. Similarly, the mechanism can be employed to detect pressure changes. The areas where the ridges (1001) are, can apply pressure, deforming the top electrode (400) and the top layer (500) causing a change in the distance between the nanostructures (200) and the top electrode (400), resulting in the capacitance change that can be measured. The change in the distance can be correlated to the applied pressure and hence the device can be used to measure pressure.

Figure 4:
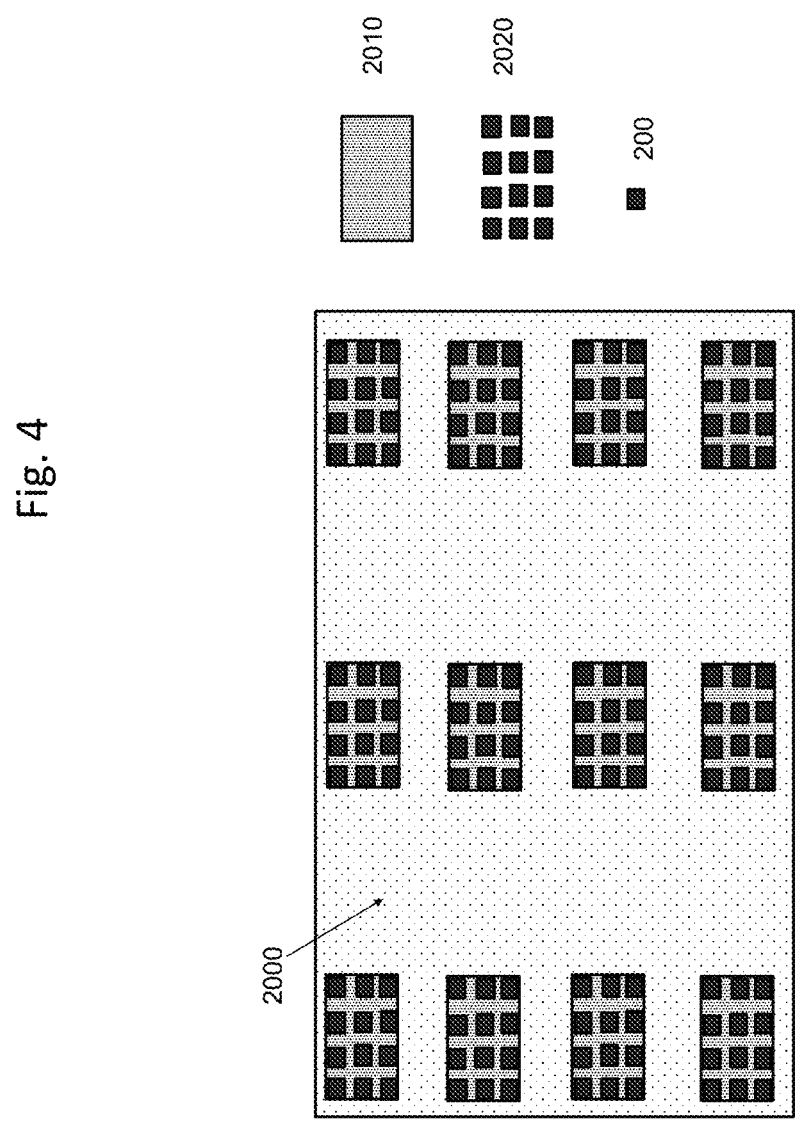
FIG. 4 Illustrates an array arrangement of nanostructure array devices on a surface.

FIG. 4 shows a possible arrangement of the device described in FIG. 1 and FIG. 2 on a specific area, labeled 2000. Each squares (2010) describes an array of nanostructures that can be composed of X and Y number of nanostructures. X and Y can be numbers from 2 to 500,000. The arrays of nanostructures are then organized in a pattern forming a "fingerprint sensor array" depicted in the array of black squares (2020). The fingerprint sensor array is placed in strategic locations called sensor array locations shown as (2010). A distribution of such locations on (2000) is also represented showing how arrays of sensing areas can be formed. This strategy can increase the sensing precision by deploying multiple sensors in specific area for fingerprint sensing or pressure sensing. The change in the capacitance can be processed by electronics and software to generate fingerprints or spatial resolution of pressure, electronically.

Figure 5:
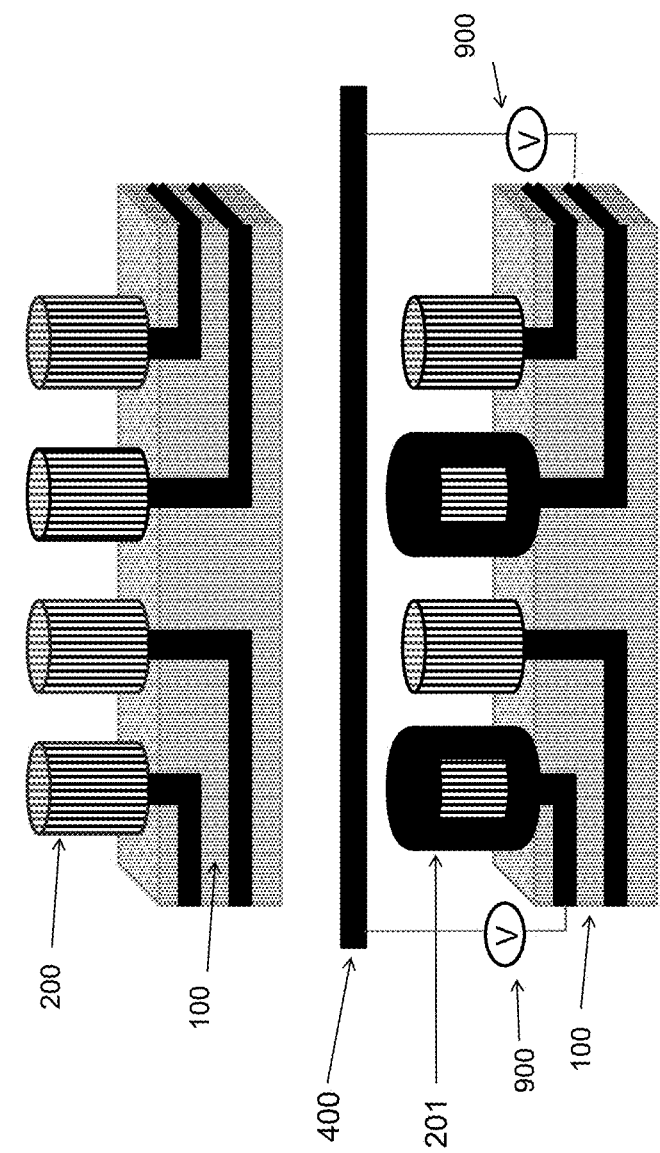
FIG. 5 Illustrates a charged nanostructure array based device with a continuous top electrode.

FIG. 5 shows the device shown in FIG. 1 in a simplified format. An array of nanostructures (200) is placed on a substrate (100) (formed of silicon and silicon dioxide) with an electrical portion embedded in the substrate. A top electrode (400) is placed on the nanostructure (200) array and voltage, V, (900) is applied between the nanostructure (200) and the top electrode (400). The voltage charges the nanostructure (202) and the charge on the nanostructure is also depicted as (201).

Figure 6:
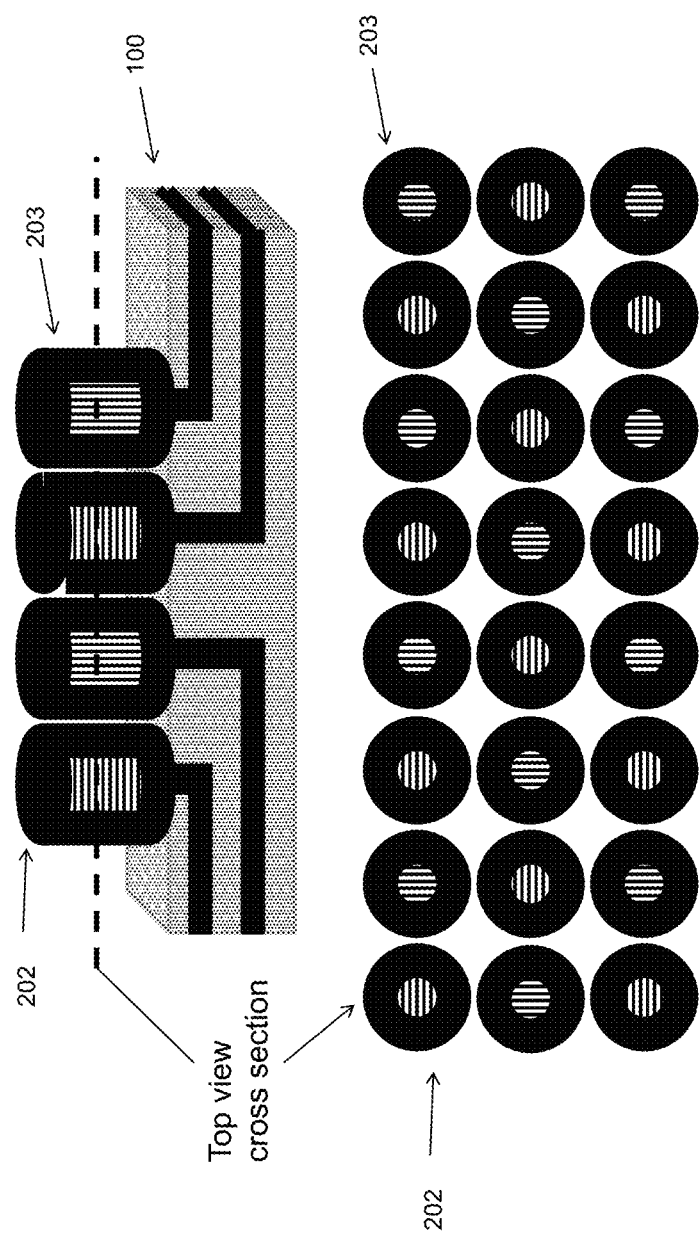
FIG. 6 Illustrates a nanostructure array based device with a continuous top electrode where individual nanostructures are charged with different respective charges.

FIG. 6 shows the nanostructure (200) array shown in FIGS. 1 and 2 and FIG. 5. It shows the cross section of the charged nanostructures where (202) shows negatively charged nanostructures and (203) shows positively charged nanostructures. Note that charge on the nanostructures can be constant charge (same polarity) and changing charge (alternating polarity). Such an array of individually addressable nanostructures can be utilized as pixilated sensor for capacitive sensing.

FIG. 7 shows the device described in FIG. 1, FIG. 2 and FIG. 5-6 in detail. A device where each nanostructure (200) has a base size (210) and is composed of nano-material (carbon nanotubes, nanofibers, nano rods etc). The distance, (213) is the gap between each nano-material and can range from 1-100 nm. The two nanostructures (200) are separated from each other by a distance (800) that can range from 1-100,000 nm. The nanostructures are charged with a "positive charge" (202) or negative charge (203) as seen in FIG. 7. Each nanomaterial has a base size (212) of 1-100 nm and height (211) that can range from 1-1,000,000 nm.

EXAMPLE EMBODIMENTS

Embodiment 1

In an embodiment, an arrangement of individually addressable nanostructures (200) in an array on a substrate (100), wherein the substrate (100) is non-conducting with conducing electrical portions within the substrate, wherein the conducting electrical portions form electrical contacts with the nanostructures forming the individually addressable nanostructures in an array, wherein the said nanostructures (200) are covered with a layer of dielectric material (300), wherein the layer of dielectric material has a first face and a second face, wherein a top electrode (400) is placed on the first face of the layer of dielectric material opposite to the second face in contact with the substrate where nanostructures are arranged, wherein a top protective layer (500) is placed on the top electrode (400), the arrangement is such that when a voltage (900) is applied between the nanostructures (200) and the top electrodes (400), an electric field (600) is generated between the said nanostructures and the said top electrode and an electric capacitance (700) is formed between the nanostructures and the top electrode.

Embodiment 2

In an embodiment, an arrangement of individually addressable nanostructure based top electrode arrangement on top of the dielectric material. The size and shape of the top electrodes can vary similar to the nanostructures in the array format arranged on the substrate. The electric field and the capacitance between the top and bottom nanostructures is generated with a voltage, V is applied between the electrodes.

Embodiment 3

In an embodiment, a device is described which is used as a fingerprint sensor when a finger placed on the device. Fingers have ridges and valleys that form the Fingerprints. The areas where the ridges are in contact with the device, a capacitance is developed, resulting in increase in capacitance. This increase in capacitance can be detected as an electrical signal using external circuit attached to the electrical contacts in the substrate. The areas where valleys are on top of the device, no signal is detected as no increase in the capacitance is created. This mechanism can be employed to perform fingerprint sensing.

Embodiment 4

In an embodiment where a possible arrangement of the said device is described. Each said array of nanostructures that are composed of and X and Y number of nanostructures. X and Y are numbers from 2 to 500. The arrays of nanostructures are then organized in a pattern forming a "fingerprint sensor array" depicted in the array of said squares. The fingerprint sensor array is placed in strategic locations called sensor array locations. A distribution of such locations on the said large area form finger print sensor, increase the sensing precision by deploying multiple sensors in specific area.

Embodiment 5

In an embodiment where is an array of nanostructures is placed on a substrate (formed of silicon and silicon dioxide) with metal 2 as electrical portion embedded in the substrate. A top electrode is placed on the nanostructure array and voltage, V, is applied between the nanostructure and the top electrode. The voltage charges the nanostructure causes a change in the the charge on the nanostructure.

Embodiment 6

In an embodiment where the nanostructure array is charged with constant charge and changing charges. Such an array of individually addressable nanostructures can be utilized as pixilated sensor for capacitive sensing.

Embodiment 7

In an embodiment where each nanostructure is 500 nm$^2$ base size and is composed nanomaterial chosen from but not limited to carbon nanotubes, nanofibers, nano rods. The distance between each nanomaterial element (in case of nanotubes, each nanotube in the nanostructure) is 5 nm. The two nanostructures are 500 nm apart from each other. The nanostructures are charged with a "+charge".

Embodiment 8

In an embodiment where the nanostructures can be used as a drive and sense electrodes sensor may each be formed from a conductive and/or semi-conductive material. Suitable materials for top electrode that is not composed of nanostructures include transparent inorganic and organic conductive materials, chosen from the list but not limited to ITO (indium tin oxide), ATO (antimony tin oxide), tin oxide, PEDOT or other conductive polymers, and carbon nanotube or metal nanowire impregnated and composite materials.

Embodiment 9

In an embodiment where the nanostructures are composed of but not limited to carbon nanotubes or carbon nanofibers or Zinc oxide Nano rods or silicon nanowires or other nano materials.

Embodiment 10

In an embodiment where the top electrode (400) is not required to measure the capacitance change between the nanostructure (200) and the top layer (500) and an electrical signal can be measured as passive capacitive coupling using external circuit attached to the electrical contacts in the substrate (100)

Embodiment 11

In an embodiment where pressure is applied on the device at the top layer (500) and the pressure results in deforming the top layer (500) and the top electrode (400) causing a change in the distance between the nanostructures (200) and the top electrode (400). The resulting change in the distance causes a change in the capacitance (700) between the nanostructures (200) and the top electrode (400). The change in the capacitance can be measured as an electrical signal using external circuit attached to the electrical contacts in the substrate (100). The change in the distance can be correlated to the applied pressure and the device can measure pressure.

Embodiment 12

In an embodiment the the nanostructures can be connected to external electrical circuit for power and signal processing software to obtain spatial resolution of finger prints or pressure on a surface or tactile pressure on a surface or other such applications.

Embodiment 13

In an embodiment where the nanostructures can be functionalized with various chemicals for enhancing the sensing capabilities.

Embodiment 14

In an embodiment the dielectric properties of the dielectric material are an important component in determining the capacitance and supercapacitance properties of the device.

The properties of the dielectric material (like stiffness) also effect the sensitivity of the pressure sensor.

Embodiment 14

In an embodiment the dielectric material is chosen from the list but is not limited to this list including air, polymer, ceramics, oil, silicone, quarts, mica, teflon, and strontrium

Embodiment 15

In an embodiment the dielectric materials are electrical insulator that can be polarized by an applied electric field. That means that dielectric materials are insulating materials or a very poor conductor of electric current. When the dielectric materials are placed in an electric field, no current flows through them they do not have loosely bound or free electrons that may drift through the material. Instead, electric polarization occurs.

Embodiment 16

In an embodiment, the nano structures can be formed on a substrate by evaporating a metal catalyst in areas patterned on the substrate using lithography, deep UV lithography or electron beam lithography techniques followed by chemical vapor deposition process to grow the nanomaterials at locations where the catalyst was deposited.

Embodiment 17

In an embodiment the materials for the top electrode are chosen from the list but is not limited to this list including metals, conducting polymers like copper, platinum, titanium, conducting epoxy, silver paint, ITO (indium tin oxide), ATO (antimony tin oxide), tin oxide, PEDOT or other conductive polymers, and carbon nanotube or metal nanowire impregnated and composite materials.

Embodiment 18

In an embodiment the substrate is is chosen from the list but is not limited to this list including flexible substrate like polymers, silicones, polyamide,

Embodiment 19

In an embodiment the substrate is is chosen from the list but is not limited to this list including rigid substrates like silicon and silicon dioxide.

Embodiment 18

In an embodiment the substrate is chosen from the list but is not limited to this list including a combination of solid and flexible of silicon islands in a polymer film connected with metal contact lines like small wires or thin films of metals

Embodiment 19

In an embodiment, pixilated capacitance can be measured using device (3000). The device (2000) where an arrangement of the said nanostructures (200) is described in an array of arrays for higher spatial resolution measurements, wherein each squares (2010) describes an array of nanostructures that can be composed of at least two nanostructures, wherein the arrays of nanostructures are organized in a pattern forming a "fingerprint sensor array" or "pressure sensor array" in the sensor array (2020), wherein the sensor array (2020) is placed in strategic locations called sensor array locations (2010), wherein a distribution of such locations on (2000) is utilized to increase sensing precision by deploying multiple sensors in specific area and performing differential sensing, wherein the change in the capacitance can be processed by electronics and software to generate fingerprints or spatial resolution of pressure, electronically.

Embodiment 20

In an embodiment, a device (3000) comprising of individually addressable nanostructures (200) in an array on a substrate (100)

wherein the substrate (100) is non-conducting with conducting electrical portions within the substrate, wherein the conducting electrical portions form electrical contacts with the nanostructures forming the individually addressable nanostructures in an array, wherein the said nanostructures (200) are covered with a layer of dielectric material (300), wherein the layer of dielectric material has a first face and a second face, wherein a top electrode (400) is placed on the first face of the layer of dielectric material opposite to the second face in contact with the substrate where nanostructures are arranged, wherein a top protective layer (500) is placed on the top electrode (400), the device is such that when a voltage (900) is applied between the nanostructures (200) and the top electrodes (400), an electric field (600) is generated between the said nanostructures and the said top electrode and an electric capacitance (700) is formed between the nanostructures and the top electrode.

Embodiment 21

In an embodiment, a device according to embodiment 20 wherein a finger (1000) placed on the device at the top layer (500) wherein the finger comprises of an arrangement of ridges (1001) and valleys (1002) to form a fingerprint, wherein the areas where the ridges (1001) are in contact with the top protective layer (500) of the device, a capacitance (701) is developed, resulting in an increase in capacitance between the nanostructures (200) and the top electrode (400), wherein the increase in capacitance is detected as electrical signals using external circuit attached to the electrical contacts in the substrate (100), wherein the electrical signals are processed to perform fingerprint sensing.

Embodiment 22

In an embodiment, a device according to embodiment 20 where pressure is applied on the device at the top layer (500)

wherein the pressure results in deforming the top protective layer (500) and the top electrode (400) causing a change in the distance between the nanostructures (200) and the top electrode (400), wherein the resulting change in the distance causes a change in the capacitance (700) between the nanostructures (200) and the top electrode (400), wherein the change in the capacitance can be measured as electrical signals using external circuit attached to the electrical contacts in the substrate (100), wherein the change in the capacitance is correlated to the applied pressure on the device to measure pressure.

Embodiment 23

In an embodiment, a device comprising of individually addressable nanostructures (200) in an array on a substrate (100)

wherein the substrate (100) is non-conducting with conducing electrical portions within the substrate, wherein the conducting electrical portions form electrical contacts with the nanostructures forming the individually addressable nanostructures in an array, wherein the said nanostructures (200) are covered with a layer of dielectric material (300), wherein the layer of dielectric material has a first face and a second face, the device is such that when a voltage (900) is applied between the nanostructures (200) and the first face of the layer of dielectric material (300) opposite to the second face in contact with the substrate where nanostructures are arranged, an electric field (600) is generated between the said nanostructures and the said first face of the layer of dielectric material (300), and an electric capacitance (700) is formed between the nanostructures and the first face of the layer of dielectric material (300).

wherein an electrical signal can be measured as passive capacitive coupling using external circuit attached to the electrical contacts in the substrate (100).

EXAMPLES

The following are a few examples of the invention discussed in this application:

Example 1

In an example, an assembly of individually addressable nanostructures (200) in an array on a substrate (100)

wherein the substrate (100) is non-conducting with conducing electrical portions within the substrate, wherein the conducting electrical portions form electrical contacts with the nanostructures forming the individually addressable nanostructures in an array, wherein the said nanostructures (200) are covered with a layer of dielectric material (300), wherein the layer of dielectric material has a first face and a second face, wherein a top electrode (400) is placed on the first face of the layer of dielectric material opposite to the second face in contact with the substrate where nanostructures are arranged, wherein a top protective layer (500) is placed on the top electrode (400), the arrangement is such that when a voltage (900) is applied between the nanostructures (200) and the top electrodes (400), an electric field (600) is generated between the said nanostructures and the said top electrode and an electric capacitance (700) is formed between the nanostructures and the top electrode.

Example 2

In an example, the substrate (100) is silicon with metal platinum contact lines.

Example 3

In an example, the nanostructures (200) are made of carbon nanotubes.

Example 4

In an example, the nanostructures have base size (210) of 500 nm sq. and the nanostructures are 500 nm high (211) with the distance (800) between the nanostructures is 500 nm.

Example 5

In an example, the nanostructures are covered with a dielectric layer (300) of parylene C.

Example 6

In an example, the dielectric layer of parylene c is 550 nm thick.

Example 7

In an example, the top electrode (400) is a copper thin film.

Example 8

In an example, the top electrode is is 100 nm thick.

Example 9

In an example, top protective layer (500) is made of polymer, parylene C.

Example 10

In an example, the top protective layer is 500 nm thick.

Example 11

In an example, a voltage (900) of 3 V is applied between the top electrode (400) and the nanostructures (200).

Example 12

In an example, where the examples 1-11 form a device (3000) that can be used to measure fingerprints or pressure changes.

Example 13

In an example, a finger is placed on the top protective layer (500) while a 3 V voltage is applied between the top electrode (400) and the nanostructures (200) and a change in the capacitance is produced where the ridges touch the top protective layer (500) due to capacitive coupling.

Example 14

In an example, a pressure is applied on the top protective layer (500) while a 3 V voltage is applied between the top electrode (400) and the nanostructures (200) and a change in the capacitance is produced where the pressure applied deforms or bends the top protective layer (500) and the top electrode (400) changing the distance between the top electrode (400) and the nanostructures.

Example 15

In an example, where the change in the capacitance is measured by an external circuit connected to the electrical conducting portions in the substrate (100) and a software is used to measure and analyze the change in the capacitance.

Example 16

In an example, where the adjacent nanostructures are charged with different charges and the capacitance is measured by an external circuit connected to the electrical conducting portions in the substrate (100) and a software is used to measure and analyze the change in the capacitance.

The invention claimed is:

1. An arrangement of individually addressable nanostructures (200) in an array on a substrate (100)
    wherein the substrate (100) is non-conducting with conducing electrical portions within the substrate,
    wherein the conducting electrical portions form electrical contacts with the nanostructures forming the individually addressable nanostructures in an array,
    wherein the said nanostructures (200) are covered with a layer of dielectric material (300),
    wherein the layer of dielectric material has a first face and a second face,
    wherein a top electrode (400) is placed on the first face of the layer of dielectric material opposite to the second face in contact with the substrate where nanostructures are arranged,
    wherein a top protective layer (500) is placed on the top electrode (400),
    the arrangement is such that when a voltage (900) is applied between the nanostructures (200) and the top electrodes (400), an electric field (600) is generated between the said nanostructures and the said top electrode and an electric capacitance (700) is formed between the nanostructures and the top electrode.

2. The arrangement of claim 1 wherein the said nanostructures (200) can be 10-1,000,000 nm in base size (210) and range from 10-1,000,000 nm in height (220). The distance between the said nanostructures (800) in the array can also range from 10-1,000,000 nm.

3. The arrangement of claim 1 wherein dielectric material is selected from the group consisting of air, polymer, ceramics, oil, silicone, quarts, mica, teflon, and strontrium.

4. The arrangement of claim 1 wherein the dielectric material (300) is at least 1-500,000 nm thicker than the height of the nanostructures.

5. The arrangement of claim 1 wherein the top layer (500) is selected from the group consisting of glass, polymers, ceramic or other robust material.

6. The arrangement of claim 1 wherein the direction of the electrical field (600) is dependent on the polarity of the voltage (900) applied.

7. The arrangement of claim 1 where the top electrode is an array of individually addressable electrical portions (401).

8. The arrangement of claim 5 wherein the individual addressable electrical portions of the top electrode are aligned over the individually addressable nanostructures, wherein the electric field (600) and the capacitance (700) between the electrode (401) and nanostructures (200) is formed when a voltage (900) is applied between the said electrode and the nanostructure.

9. The arrangement of claim 1, wherein the size of the top electrodes (401) can range from 10-100,000 nm in base size and height.

10. The arrangement of claim 1, wherein the shape of the top electrodes corresponds to the nanostructures (200) in the array arranged on the substrate (100).

11. An device (3000) comprising of individually addressable nanostructures (200) in an array on a substrate (100)
    wherein the substrate (100) is non-conducting with conducing electrical portions within the substrate,
    wherein the conducting electrical portions form electrical contacts with the nanostructures forming the individually addressable nanostructures in an array,
    wherein the said nanostructures (200) are covered with a layer of dielectric material (300),
    wherein the layer of dielectric material has a first face and a second face,
    wherein a top electrode (400) is placed on the first face of the layer of dielectric material opposite to the second face in contact with the substrate where nanostructures are arranged,
    wherein a top protective layer (500) is placed on the top electrode (400),
    the device is such that when a voltage (900) is applied between the nanostructures (200) and the top electrodes (400), an electric field (600) is generated between the said nanostructures and the said top electrode and an electric capacitance (700) is formed between the nanostructures and the top electrode.

12. The device according to claim 11 wherein a finger (1000) placed on the device at the top layer (500) wherein the finger comprises of an arrangement of ridges (1001) and valleys (1002) to form a fingerprint,
    wherein the areas where the ridges (1001) are in contact with the top protective layer (500) of the device, a capacitance (701) is developed, resulting in an increase in capacitance between the nanostructures (200) and the top electrode (400),
    wherein the increase in capacitance is detected as electrical signals using external circuit attached to the electrical contacts in the substrate (100),
    wherein the electrical signals are processed to perform fingerprint sensing.

13. The device according to claim 11 where pressure is applied on the device at the top layer (500)
    wherein the pressure results in deforming the top protective layer (500) and the top electrode (400) causing a change in the distance between the nanostructures (200) and the top electrode (400),
    wherein the resulting change in the distance causes a change in the capacitance (700) between the nanostructures (200) and the top electrode (400),
    wherein the change in the capacitance can be measured as electrical signals using external circuit attached to the electrical contacts in the substrate (100),
    wherein the change in the capacitance is correlated to the applied pressure on the device to measure pressure.

14. A device comprising of individually addressable nanostructures (200) in an array on a substrate (100)
    wherein the substrate (100) is non-conducting with conducing electrical portions within the substrate, wherein the conducting electrical portions form electrical contacts with the nanostructures forming the individually addressable nanostructures in an array, wherein the said nanostructures (200) are covered with a layer of dielectric material (300), wherein the layer of dielectric material has a first face and a second face, the device is such that when a voltage (900) is applied between the nanostructures (200) and the first face of the layer of dielectric material (300) opposite to the second face in contact with the substrate where nanostructures are arranged, an electric field (600) is generated between the said nanostructures and the said first face of the layer of dielectric material (300), and an electric capacitance (700) is formed between the nanostructures and the first face of the layer of dielectric material (300), wherein an electrical signal can be measured as passive capacitive coupling using external circuit attached to the electrical contacts in the substrate (100).

15. An array of devices according to claim 11 arranged spatially over a surface (2000) forming a larger sensing surface.

16. The device according to claim 11 wherein an array of nanostructures (200) is placed on a substrate (100) with electrical portions embedded in the substrate, wherein a top electrode (400) is placed on the nanostructure (200) array and voltage, (900) is applied between at least one nanostructure and the top electrode, wherein the applied voltage causes a change in the charge on the said nanostructure (201).

17. The device according to claim 11, wherein a first set of nanostructures (202) in the array can be charged a first charge and a second set of nanostructures (203) in the array can be charged a second charge, wherein the electrical interaction between the first set and the second set of nanostructures will generate an electrical signal which can be utilized as pixilated sensor for capacitive sensing using external circuit connected to substrate (100).

18. The device according to claim 11, wherein the nanostructure array can be charged with constant charge and changing charges (alternating charge).

19. The device according to claim 11 wherein the nanostructures are chemically functionalized for enhancing the charging on the nanostructures.

20. The device according to claim 11 wherein each nanostructure (200) has a base size (210) where (210) ranges from 1-1,000,000 nm Wherein the nanostructures (200) are material that are selected from the group consisting of nano-material, carbon nanotubes, nanofibers or nano rods Wherein The distance, (213) is the gap between each nano-material that range from 1-100 nm.

Wherein the two nanostructures (200) are separated from each other by a distance (800) where (800) ranges from 1-100,000 nm wherein the nanostructures are charged with a "positive charge" (202) or negative charge (203) by the electrical portion in substrate (100)

wherein each nanomaterial has a base size (212) of 1-100 nm and height (211) that ranges from 1-1,000,000 nm.

\* \* \* \* \*

UNITED STATES PATENT AND TRADEMARK OFFICE
CERTIFICATE OF CORRECTION

PATENT NO. : 9,953,202 B2
APPLICATION NO. : 15/152504
DATED : April 24, 2018
INVENTOR(S) : Waqas Khalid Page 1 of 1

It is certified that error appears in the above-identified patent and that said Letters Patent is hereby corrected as shown below:

In the Claims

Claim 11 (Column 12, Line 1), replace "An device" with --A device--,

Claim 20 (Column 14, Line 19), replace "Wherein" with --wherein--,

Claim 20 (Column 14, Line 22), replace "Wherein The" with --wherein the--,

Claim 20 (Column 14, Line 24), replace "Wherein" with --wherein--.

Signed and Sealed this
Twenty-eighth Day of May, 2019

Andrei Iancu
*Director of the United States Patent and Trademark Office*